United States Patent
Szelest et al.

(10) Patent No.: US 11,543,464 B2
(45) Date of Patent: Jan. 3, 2023

(54) WIRE HARNESS TEST DEVICE AND METHOD FOR VERIFYING CONNECTIONS WHEN ASSEMBLING A WIRE HARNESS

(71) Applicant: Aptiv Technologies Limited, St. Michael (BB)

(72) Inventors: Marcin Szelest, Dublin (IE); Pawel Skruch, Dublin (IE)

(73) Assignee: Aptiv Technologies Limited, St. Michael (BB)

( * ) Notice: Subject to any disclaimer, the term of this patent is extended or adjusted under 35 U.S.C. 154(b) by 12 days.

(21) Appl. No.: 17/171,923

(22) Filed: Feb. 9, 2021

(65) Prior Publication Data
US 2021/0270912 A1    Sep. 2, 2021

(30) Foreign Application Priority Data
Feb. 27, 2020  (EP) .................................. 20159896

(51) Int. Cl.
*G01R 31/58*    (2020.01)
*G01R 31/00*    (2006.01)

(52) U.S. Cl.
CPC ........... *G01R 31/58* (2020.01); *G01R 31/008* (2013.01)

(58) Field of Classification Search
CPC ........ G01R 31/58–60; G01R 31/67–69; G01R 31/008
See application file for complete search history.

(56) References Cited

U.S. PATENT DOCUMENTS 3,681,686 A    8/1972 Connally
3,891,811 A  *  6/1975 Miller .................... H04M 3/229
                                                      379/25

(Continued)

FOREIGN PATENT DOCUMENTS

CN    109470974    3/2019
DE    10019860    10/2001

(Continued)

OTHER PUBLICATIONS

"Extended European Search Report", EP Application No. 20159893. 5, dated Aug. 17, 2020, 10 pages.

(Continued)

*Primary Examiner* — Patrick Assouad
*Assistant Examiner* — Demetrius R Pretlow
(74) *Attorney, Agent, or Firm* — Sawtooth Patent Group PLLC

(57) ABSTRACT

A device for verifying wiring connections during the assembly of a wire harness. The wire harness comprises a connector having an array of terminals and a plurality wires connected to individual ones of the terminals. The device comprises a transmitter for applying different signals to different terminals for emitting a corresponding electromagnetic signal from a wire connected to that terminal. Each electromagnetic signal has an associated identifying characteristic. A detector is used to receive the electromagnetic signals emitted from the wires connected to terminals, and a processor generates an output which is used to identify the received electromagnetic signals based on their detected identifying characteristics. A method of assembling a wire harness using the device is also disclosed.

20 Claims, 1 Drawing Sheet

(56) References Cited

U.S. PATENT DOCUMENTS

| | | | | |
|---|---|---|---|---|
| 4,506,210 A | * | 3/1985 | Chase | G01R 31/60 324/66 |
| 4,937,519 A | * | 6/1990 | Fields, III | G01R 31/60 324/540 |
| 4,951,385 A | | 8/1990 | Desanto | |
| 4,959,792 A | * | 9/1990 | Sullivan | G01R 31/58 324/555 |
| 5,260,659 A | * | 11/1993 | Flowerdew | G01V 3/06 324/66 |
| 5,280,251 A | * | 1/1994 | Strangio | G01R 31/58 324/133 |
| 5,361,029 A | * | 11/1994 | Rider | G01R 31/60 324/67 |
| 5,420,512 A | * | 5/1995 | Spillane | G01R 31/58 324/66 |
| 5,483,169 A | * | 1/1996 | Despain | G01R 27/04 324/533 |
| 5,557,651 A | * | 9/1996 | Wissman | H04M 3/28 379/22.07 |
| 5,570,010 A | * | 10/1996 | Jin | G01R 31/58 324/67 |
| 6,282,265 B1 | | 8/2001 | Lowell et al. | |
| 6,448,778 B1 | * | 9/2002 | Rankin | G01R 31/007 324/503 |
| 8,552,709 B2 | * | 10/2013 | McCasland | G01R 31/58 324/67 |
| 9,813,810 B1 | | 11/2017 | Nongpiur | |
| 10,996,286 B2 | * | 5/2021 | Schmier, II | H01R 13/6683 |
| 2002/0171434 A1 | | 11/2002 | Stanford et al. | |
| 2004/0066202 A1 | * | 4/2004 | Pereira | G01R 31/58 324/539 |
| 2005/0110500 A1 | * | 5/2005 | Hoyte | G01R 31/58 324/535 |
| 2006/0043976 A1 | * | 3/2006 | Gervais | G01R 31/58 324/508 |
| 2007/0030014 A1 | * | 2/2007 | Pandya | G01R 31/58 324/626 |
| 2009/0289616 A1 | * | 11/2009 | Suozzo | G01R 31/58 324/66 |
| 2010/0281684 A1 | | 11/2010 | Selbach | |
| 2011/0313708 A1 | * | 12/2011 | Jin | G01R 31/2818 702/117 |
| 2013/0018624 A1 | | 1/2013 | Bhatnagar et al. | |
| 2013/0049731 A1 | | 2/2013 | Mathis et al. | |
| 2014/0292349 A1 | | 10/2014 | Lussier | |
| 2014/0327539 A1 | * | 11/2014 | Cudak | G01R 31/58 340/539.1 |
| 2015/0073967 A1 | | 3/2015 | Katsuyama | |
| 2016/0356836 A1 | * | 12/2016 | Horan | H04B 3/46 |
| 2018/0276321 A1 | | 9/2018 | Angelico et al. | |
| 2019/0120889 A1 | * | 4/2019 | Carcia | G01R 31/54 |
| 2019/0310298 A1 | * | 10/2019 | Bottman | G01R 31/083 |
| 2021/0271323 A1 | | 9/2021 | Szelest et al. | |
| 2021/0274649 A1 | | 9/2021 | Szelest et al. | |

FOREIGN PATENT DOCUMENTS

| | | | |
|---|---|---|---|
| DE | 10308403 | | 9/2004 |
| DE | 102016213536 | | 1/2018 |
| EP | 2075883 | | 7/2009 |
| EP | 2910430 | | 8/2015 |
| EP | 3229496 | | 10/2017 |
| EP | 3460495 | | 3/2019 |
| EP | 3582511 | | 12/2019 |
| JP | 3640150 B2 | | 4/2005 |
| JP | 2008226506 | | 9/2008 |
| JP | 4920191 | | 4/2012 |
| KR | 20100120176 A | | 11/2010 |
| KR | 20120101873 A | * | 9/2012 |
| WO | 0179871 | | 10/2001 |
| WO | 2015053936 | | 4/2015 |
| WO | 2016090342 | | 6/2016 |
| WO | 2017062124 | | 4/2017 |
| WO | 2019025113 | | 2/2019 |
| WO | 2019187349 | | 10/2019 |

OTHER PUBLICATIONS

"Extended European Search Report", EP Application No. 20159891.9, dated Aug. 19, 2020, 10 pages.

"Extended European Search Report", EP Application No. 20159896.8, dated Oct. 2, 2020, 10 pages.

Kirk, "Cognitive Software Defined Radar: A Reactive Approach to RFI Avoidance", 6 pages.

* cited by examiner

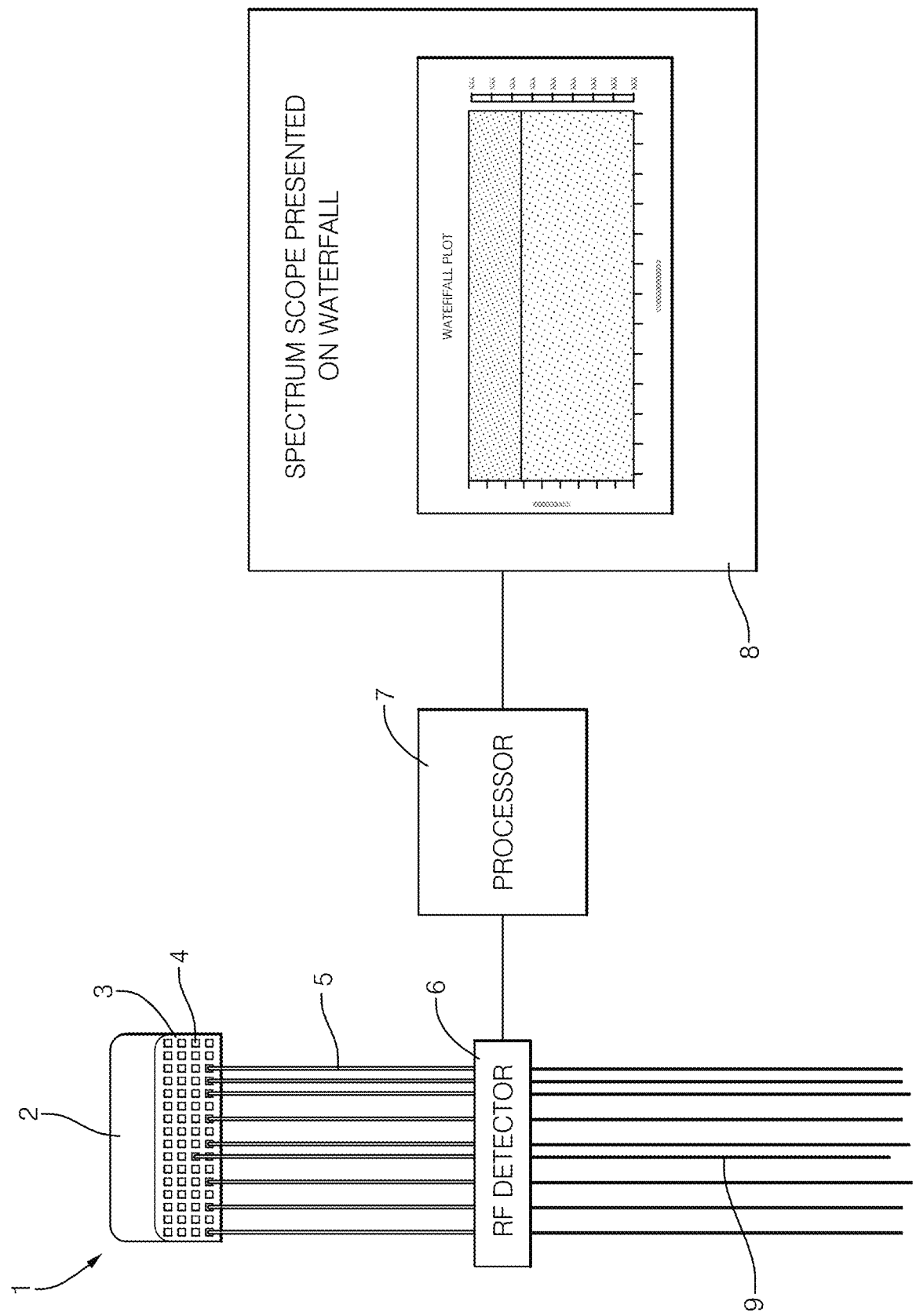

WIRE HARNESS TEST DEVICE AND METHOD FOR VERIFYING CONNECTIONS WHEN ASSEMBLING A WIRE HARNESS

CROSS-REFERENCE TO RELATED APPLICATION

This application claims priority to European Patent Application Number 20159896.8, filed Feb. 27, 2020, the disclosure of which is hereby incorporated by reference in its entirety herein.

INTRODUCTION

The present disclosure relates to a wire harness testing device and a method of verifying connections when assembling a wire harness. In particular, the present disclosure concerns a test device for verifying connections as the wire harness is assembled, and a method of using the same. The present disclosure is particularly suited to the assembly of wire harnesses for the automotive and aviation sectors.

BACKGROUND

Wire harnesses (also known as cable harnesses, and wiring assemblies or looms) are used to connect electrical components within automobiles and aeroplanes, as well as other vehicles, and construction machinery. By binding a large number of wires together in a bundle, wiring can thereby be installed into a vehicle more quickly and reliably. However, in spite of increasing automation, wire harnesses are still generally assembled by hand. As such, wire harnesses are often one of the most expensive parts of a vehicle.

Wire harnesses are typically assembled on an assembly board, which comprises a circuit diagram specific to the particular wire harness design. A technician will then match up wires and mini-bundles of wires to the circuit diagram on the assembly board surface. Once all the wires have been assembled on the board, the main bundle of wires will then be secured together using cable ties or tape, and will then be removed for testing. However, because of this, faulty electrical connections will often only be detected once the wire harness has been fully assembled, taped together, and removed from the assembly board.

A particular problem occurs when a larger wire harness includes one or more sub-components of smaller wire harnesses. That is, each sub-component may comprise a small wire harness having a bundle of wires connected to one or more dedicated connectors, with each sub-component being preassembled before it is connected to the main assembly board to become part of the main wire-harness. In some instances, these sub-components are assembled as so-called "kits" in which the associated wire-harness is terminated with a connector only at one end. Consequently, the distal ends of the wires are unterminated and left floating, with these unterminated ends remaining unconnected until much later in the assembly processes when the sub-component is wired into the main wire harness. In such a scenario, conventionally, it is not possible to perform early stage testing to verify that the correct wires have been connected to the correct terminals of the connector. This is because it would be economically unviable to manually connect each unterminated wire to a test rig for testing. As such, current assessment of the correctness of the wiring within a sub-component or kit is based solely on visual inspection. Faults are therefore often not identified until the main wire harness has been fully assembled. At this late stage, correcting the fault would require considerable manual labour to unbind the cable bundle, and then locate and repair the wiring.

The present disclosure seeks to address the above issues.

SUMMARY

According to a first aspect, there is provided a device for verifying wiring connections during the assembly of a wire harness, the wire harness comprising a connector having an array of terminals and a plurality wires connected to individual ones of the terminals, the device comprising: a transmitter for applying different signals to different terminals for emitting a corresponding electromagnetic signal from a wire connected to that terminal, each electromagnetic signal having an associated identifying characteristic; a detector for receiving electromagnetic signals emitted from wires connected to terminals; and a processor for generating an output for identifying the received electromagnetic signals based on their detected identifying characteristics.

In this way, the individual wires serve as antenna for the respective terminals to which they are connected. Consequently, the detector, which may be provided as an aerial for receiving the electromagnetic waves, is able to detect signals from terminals which have had wires connected, whilst signals applied to unconnected terminals are not received. As each terminal has a different signal, it is therefore possible to identify which terminals have been wired and which haven't based on the identifying characteristics of the signals that are detected. Importantly, by using electromagnetic waves, testing may be conducted without having to electrically connect both ends of the wires to a testing apparatus. That is, the detector merely needs to be sufficiently close to the wires to receive the electromagnetic emissions, and does not require a physical connection. At the same time, the signals applied by the transmitter may be low power, and in embodiments are ultra-low power. Therefore, the transmitter can remain active as a technician connects new wires into the connector housing during the wire harness assembly process. A technician may thereby identify when a wire has been connected to the wrong terminal much earlier in the assembly process, and hence avoid the time and cost of having to undertake reworks after the wire harness has been fully assembled. It will be understood that the transmitter may be implemented as a Software-defined-radio (SDR) transmitter and the detector may be implemented as an SDR receiver.

In embodiments, the identifying characteristic is frequency. As such, the transmitter may apply a plurality signals at different frequencies and the output may be based on the frequency spectrum of the detected signals. In embodiments, the plurality of signals are sine signals with orthogonal frequency (no harmonics). Such, sine signals may be keyed with a predefined frequency for delivering a larger variety of received waterfalls.

In embodiments, the electromagnetic signals are radio frequency signals. This thereby allows for the generation and detection of the signals using relatively simple transmitter and detector apparatus, for example using SDR equipment.

In embodiments, the processor comprises a display for displaying the output as a graphical representation of the identified signals. In this way, the processor may be provided as a computer workstation, with the display providing a technician with a graphical feedback of the wiring connections that have been made.

In embodiments, the processor applies a Fast Fourier transform (FFT) for generating a time-frequency graphical representation of the identified signals. The change of FFT in time may be displayed on a Waterfall plot, and an artificial intelligence (AI) neural network may be used to interpret the received spectrum.

In embodiments, the time-frequency graphical representation of the identified signals comprises a waterfall plot. In this way, the wiring of new wires to terminals can be easily identified as changes in the waterfall with the addition of new spectrum bands. Consequently, a technician assembling the wire harness can easily identify incorrect wiring operations. In embodiments, information or suggestions on connection status may also be provided by AI processing.

In embodiments, the processor outputs which terminals have had wires connected based on changes in the time-frequency graphical representation. In this way, image recognition processing techniques may be applied to the graphical representation so as to identify which terminals have been connected.

In embodiments, the processor further comprises logic for determining a wire has been connected to an incorrect terminal based on the detection of an electromagnetic signal with an identifying characteristic different to an expected identifying characteristic. In this way, the processor may be provided with specification data for the wire harness indicating which terminals should be connected, and may also indicate in which order connections should be made. Based on this, it is then possible to derive which signals, and in some embodiments the sequence of signals, that would be expected when the wire harness was being wired correctly. As such, deviations from these expected signals during the assembly process can be used to indicate when a terminal has been incorrectly wired.

In embodiments, the transmitter may comprise an interface having a plurality of ports individually connectable to individual terminals for applying the different signals thereto.

In embodiments, the plurality of ports comprises a port for each terminal within the array of terminals.

In embodiments, the interface is provided as a counterpart connector for connection to the connector of the wire harness. In this way, the interface may be provided as a counterpart male or female connector corresponding to the male or female connector provided on the wire harness. As such, the wire harness connector can be attached to the transmitter by mating the connectors together, which thereby establishes the electrical connection between the interface and the terminals pins.

According to a second aspect, there is provided a method for verifying connections when assembling a wire harness comprising the steps of: connecting a connector to a transmitter, the connector having an array of terminals; connecting a plurality of wires to individual ones of the terminals; applying, by the transmitter, different signals to different terminals for emitting a corresponding electromagnetic signal from a wire connected to that terminal, each electromagnetic signal having an associated identifying characteristic; receiving, by a detector, electromagnetic signals emitted from wires connected to terminals; and generating an output, by a processor, for identifying the received electromagnetic signals based on their detected identifying characteristics.

In this way, a technician assembling a wire harness can be alerted to instances where a wire has been connected to the wrong terminal during the assembly process. This mitigates the risk of having to undertake reworks to correct errors once the wire harness has been fully assembled. Furthermore, testing can be undertaken without needing to connect both ends of a wire to a testing apparatus, thereby allowing the testing of wire harnesses having floating ends.

In embodiments, the method further comprises applying, by the processor, a Fast Fourier transform to generate a time-frequency graphical representation of the identified signals; and displaying the time-frequency graphical representation on a display as the output. For example, in embodiments, SDR may be used to receive and initially process the signals, after which FFT is applied and then the results are displayed on a Waterfall plot.

In embodiments, the method further comprises outputting, by the processor, which terminals have had wires connected based on changes in the time-frequency graphical representation.

In embodiments, the step of connecting the plurality of wires comprises connecting the wires to their associated terminals in a sequence, and the method further comprises identifying, by the processor, when a wire has been connected to an incorrect terminal based on the detected sequence of electromagnetic signals having different identifying characteristics than an expected sequence of electromagnetic signals.

BRIEF DESCRIPTION OF DRAWING

Illustrative embodiments will now be described with reference to the accompanying drawing in which FIG. 1 shows a schematic view of a wiring test device according to an embodiment.

DETAILED DESCRIPTION

A schematic diagram of a wiring test device (1) according to an embodiment is shown in FIG. 1. The test device 1 is shown connected to a partially assembled wire harness 9, which comprises a connector housing 3 and a plurality of wires 5. In this illustrative example, the wire harness 9 is shown as a kit type harness, with the proximal ends of the wires 5 connected to individual terminal pins 4 within the terminal array of the connector housing 3, and the distal ends of the wires 5 being free floating. However, it will be understood that one or more of these wires 5 may be terminated with a plug or other connector.

The connector housing 3 is connected into a corresponding socket provided on the transmitter 2. The socket comprises a plurality of female port terminals which receive the male terminal pins 4 of the connector housing 3 when the connector housing 3 is fitted into the socket. This thereby establishes an electrical connection between the port terminals of the transmitter 2 and the individual wires 5 connected each terminal pin 4.

In use, the transmitter 2 is able to apply radio frequency, RF, orthogonal signals with different frequencies to each port within its interface. The use of orthogonal signals mitigates the risk that the signals' inferences could cause incorrect identification on detection. The signals applied to each port in turn applies the signals to each terminal pin 4 received by each port, respectively. For the terminal pins 4 to which wires 5 have been connected, those wires 5 function as antenna for emitting the associated RF signal. Conversely, terminal pins 4 which have not had wires 5 connected to do not emit, or emit at very low amplitude, their associated RF signal.

The device 1 further comprises a RF detector 6 which, in use, is located adjacent to the wires 5 and comprises an aerial for receiving RF signals emitted by the wires 5. As such, the RF detector outputs a composite RF signal comprising the sum of the different RF frequency signals emitted by the wires 5 that have been connected to terminals 4.

The RF detector 6 is connected to a processor 7 which is used to process the received RF signals and display a time-frequency plot representing the detected RF signals on display 8. This representation can therefore be used to identify which signals are present, and consequently which terminal pins 4 have had wires 5 connected.

In this embodiment, the time-frequency plot is generated using a Fast Fourier Transform algorithm and is displayed on display 8 as a waterfall plot. The waterfall plot thereby shows how the frequency components of the received composite RF signal changes over time.

During the assembly of a wire harness 9, new wires 5 are sequentially connected to terminal pins 4 of the connector housing 3. Progress during the assembly process is reflected by a corresponding change in the waterfall plot displayed on display 8. That is, as new wires 5 are connected, new spectrum bands will appear on the waterfall, thereby allowing a technician to verify that a newly connected wire 5 has been connected to the correct terminal pin 4. In instances where a wire 5 is connected to the wrong terminal pin 4, a different frequency band than the band that had been expected will appear. A technician, or AI processing, can therefore identify this deviation from the expected sequences in which spectrum bands should appear as a wiring error, allowing the mistake to be corrected immediately.

In other embodiments, the processor 7 may automate the detection of connection errors by performing image recognition on the representation of the composite RF signal. For example, the technician may be tasked with connecting the wires 5 in a predetermined sequence. During this process, the processor 7 may identify deviations from the predetermined sequence by analysing the sequence of introduced spectrum bands on waterfall plot and determining the detected connection sequence based on this. The processor 7 may therefore alert the technician if wiring errors are detected.

In other embodiments, the processor 7 may access a data store comprising specification data representing the topology of the wire harness 9 to be created. Based on this specification data, the processor 7 may generate an expected spectrum map for the desired wire harness 9. During the assembly process, the generated RF signal representation can thereby be compared to this expected spectrum map, to alert the technician to any erroneous connections.

In other embodiments, the processor 7 may further automate the detection of connection errors using an artificial intelligence, AI, algorithm. In this case, the AI algorithm may be exposed during a learning phase to the patterns of detected signals during test assembly operations. The test assembly operations may be categorised into those which result in wire harnesses being correctly connected and those which result in harnesses with defects. Based on this leaning phase, the AI algorithm may therefore identify a wider variety of connection mistakes during ongoing assembly operations based on the detected spectra over time.

Accordingly, with embodiments, wire harness faults may be detected and rectified during the assembly process, providing for early fault detection. Furthermore, testing can be performed without having to physically connect both ends of the wires in the harness to a testing apparatus.

It will be understood that the embodiment illustrated above show applications only for the purposes of illustration. In practice the disclosure may be applied to many different configurations, the detail of which being straightforward for those skilled in the art to implement.

For example, although in the above illustrative embodiments, the processor is shown as a unit physically connected to the detector, it will be understood that processing operations may be at least partially performed remotely. Equally, the processor may be connected to a server for performance data monitoring of, for instance, a technician's accuracy.

What is claimed is:

1. A device for verifying wiring connections during assembly of a wire harness, the device comprising:
   a transmitter configured to apply different signals to different terminals of an array of terminals on a connector of the wire harness, the wire harness having a plurality of wires that are each connected to an individual terminal of the array of terminals, each of the different signals applied to emit a corresponding electromagnetic signal from a wire connected to a respective terminal on the connector, each electromagnetic signal having an associated identifying characteristic;
   a detector configured to receive electromagnetic signals emitted from the plurality of wires connected to the array of terminals;
   a processor configured to generate an output that identifies the received electromagnetic signals based on detected identifying characteristics of the received electromagnetic signals, the processor further configured to determine that a wire has been connected to an incorrect terminal based on the detection of an electromagnetic signal with an identifying characteristic different than an expected identifying characteristic; and
   a display configured to display the output as a graphical representation of identified signals of the received electromagnetic signals.

2. A device according to claim 1, wherein the detected identifying characteristic is frequency.

3. A device according to claim 1, wherein the electromagnetic signals are radio frequency signals.

4. A device according to claim 1, wherein the processor is configured to apply a Fast Fourier transform for generating a time-frequency graphical representation of the identified signals.

5. A device according to claim 4, wherein the time-frequency graphical representation of the identified signals comprises a waterfall plot.

6. A device according to claim 4, wherein the output indicates which terminals have had wires connected based on changes in the time-frequency graphical representation.

7. A device according to claim 1, wherein the identifying characteristic of the wire connected to the incorrect terminal includes a different frequency band than a frequency band of the expected identifying characteristic.

8. A device according to claim 1, wherein the transmitter comprises an interface having a plurality of ports individually connectable to individual terminals to enable the different signals to be applied to the individual terminals.

9. A device according to claim 8, wherein the plurality of ports comprises a port for each terminal within the array of terminals.

10. A device according to claim 9, wherein the transmitter is configured to apply orthogonal signals with different frequencies to each port within its interface.

11. A device according to claim 8, wherein the interface is provided as a counterpart connector for connection to the connector of the wire harness.

12. A device according to claim 1, wherein the detector is configured to output a composite signal comprising a sum of the different signals emitted by the wires of the plurality of wires that have been connected to the individual terminals of the array of terminals.

13. A method for verifying connections when assembling a wire harness, the method comprising:
- connecting a connector to a transmitter, the connector having an array of terminals;
- connecting individual wires of a plurality of wires of the wire harness to individual terminals of the array of terminals;
- applying, by the transmitter, different signals to different terminals of the array of terminals to emit a corresponding electromagnetic signal from a wire connected to a respective terminal, each electromagnetic signal having an associated identifying characteristic;
- receiving, by a detector, electromagnetic signals emitted from the individual wires connected to the individual terminals;
- generating, by a processor, an output identifying the received electromagnetic signals based on detected identifying characteristics of the received electromagnetic signals;
- determining, by the processor, that a wire has been connected to an incorrect terminal based on the detection of an electromagnetic signal with an identifying characteristic different than an expected identifying characteristic; and
- displaying the output as a graphical representation of identified signals of the received electromagnetic signals.

14. A method according to claim 13, further comprising:
- applying, by the processor, a Fast Fourier transform to generate a time-frequency graphical representation of the identified signals; and
- displaying the time-frequency graphical representation on a display as the output.

15. A method according to claim 14, further comprising:
- performing image recognition on the time-frequency graphical representation of the identified signals;
- determining that the wire has been connected to the incorrect terminal based on the detection of the electromagnetic signal with the identifying characteristic different than the expected identifying characteristic comprises identifying one or more deviations in the time-frequency graphical representation from an expected graphical representation for the wire harness; and
- alerting a user to one or more erroneous connections.

16. A method according to claim 14, further comprising outputting, by the processor, which terminals have had wires connected based on changes in the time-frequency graphical representation.

17. A method according to claim 13, further comprising generating, by the detector, a composite signal comprising a sum of the received electromagnetic signals emitted from the individual wires connected to the individual terminals.

18. A method according to claim 13, wherein:
- connecting the plurality of wires comprises connecting the wires to associated terminals in a sequence; and
- the method further comprises:
  - detecting a sequence of electromagnetic signals generated based on the sequence of connecting the wires to the associated terminals; and
  - determining that the wire has been connected to the incorrect terminal based on the detection of the electromagnetic signal with the identifying characteristic different than the expected identifying characteristic comprises identifying, by the processor, when a wire has been connected to an incorrect terminal based on the detected sequence of electromagnetic signals having different identifying characteristics than an expected sequence of electromagnetic signals.

19. A method according to claim 14, wherein the time-frequency graphical representation of the identified signals comprises a waterfall plot.

20. A method according to claim 13, wherein the identifying characteristic of the wire connected to the incorrect terminal includes a different frequency band than a frequency band of the expected identifying characteristic.

* * * * *